US006320792B1

(12) United States Patent
Caser et al.

(10) Patent No.: US 6,320,792 B1
(45) Date of Patent: Nov. 20, 2001

(54) ROW DECODING CIRCUIT FOR A SEMICONDUCTOR NON-VOLATILE ELECTRICALLY PROGRAMMABLE MEMORY AND CORRESPONDING METHOD

(75) Inventors: Fabio Tassan Caser, Milan; Mauro Sali, Sant'Angelo Lodigiano; Marcello Cane, Piobesi d'Alba, all of (IT)

(73) Assignee: SGS-Thomson Microelectronics S.r.l, Agrate Brianza (IT)

( * ) Notice: Subject to any disclaimer, the term of this patent is extended or adjusted under 35 U.S.C. 154(b) by 0 days.

(21) Appl. No.: 09/633,334

(22) Filed: Aug. 7, 2000

Related U.S. Application Data

(62) Division of application No. 09/203,937, filed on Dec. 2, 1998, now Pat. No. 6,137,725, which is a division of application No. 08/824,616, filed on Mar. 27, 1997, now Pat. No. 5,848,013.

(30) Foreign Application Priority Data

Mar. 29, 1996 (EP) .................................................. 96830174

(51) Int. Cl.[7] .................................................. G11C 16/06
(52) U.S. Cl. .................................. 365/185.23; 365/185.11
(58) Field of Search .......................... 365/185.23, 185.11, 365/230.03, 230.06

(56) References Cited

U.S. PATENT DOCUMENTS

| | | | |
|---|---|---|---|
| 5,371,705 | 12/1994 | Nakayama et al. | 365/189.09 |
| 5,400,276 | 3/1995 | Takeguchi | 365/149 |
| 5,463,583 | 10/1995 | Takashina | 365/189 |
| 5,587,960 | * 12/1996 | Ferris | 365/230.03 |
| 5,631,597 | * 5/1997 | Akaogi et al. | 327/536 |
| 5,644,530 | * 7/1997 | Gautlier | 365/185.09 |
| 5,828,600 | * 10/1998 | Kato et al. | 365/185.11 |

OTHER PUBLICATIONS

European Search Report from European Patent Application 96830174.7, filed Mar. 29, 1996.
IEICE Transactions On Electronics, vol. E77–c, No. 5, Mar. 1994, Tokyo JP, pp. 791–798, Atsumi, et al. "A 16 MB Flash EEPROM With A New Self Data Refresh Scheme For A Sector Erase Operation".

* cited by examiner

Primary Examiner—Huan Hoang
(74) Attorney, Agent, or Firm—Wolf, Greenfield & Sacks, P.C.; James H. Morris

(57) ABSTRACT

The invention relates to a row decoding circuit for an electrically programmable and erasable semiconductor non-volatile storage device of the type which includes a matrix of memory cells laid out as cell rows and columns and is divided into sectors, said circuit being input row decode signals and supply voltages in order to drive an output stage incorporating a complementary pair of high-voltage MOS transistors of the pull-up and pull-down type, respectively, which are connected to form an output terminal connected to the rows of one sector of the matrix, characterized in that a MOS transistor of the P-channel depletion type with enhanced gate oxide is provided between the output terminal and the pull-down transistor. The control terminal of the depletion transistor forms a further input of the circuit.

21 Claims, 5 Drawing Sheets

ROW DECODING CIRCUIT FOR A SEMICONDUCTOR NON-VOLATILE ELECTRICALLY PROGRAMMABLE MEMORY AND CORRESPONDING METHOD

CROSS REFERENCE TO RELATED APPLICATIONS

This application is a division of application Ser. No. 09/203,937, filed Dec. 2, 1998 now U.S. Pat. No. 6,137,725, entitled row decoding circuit for a semiconductor non-volatile electrically programmable memory and corresponding method, which in turn is a division of application Ser. No. 08/824,616, filed Mar. 27, 1997, now U.S. Pat. No. 5,848,013 entitled row decoding circuit for a semiconductor non-volatile electrically programmable memory and corresponding method, which prior application is incorporated herein by reference.

BACKGROUND OF THE INVENTION

1. Field of the Invention

The present invention relates to a row decoding circuit and method for an electrically programmable semiconductor non-volatile memory.

More particularly, the invention relates to a row decoding circuit for a semiconductor non-volatile storage device which is programmable and erasable electrically and of the type including a matrix of memory cells laid out as rows and columns of cells and divided into sectors, the circuit being input row decode signals and supply voltages in order to drive an output stage which incorporates a complementary pair of high-voltage MOS transistors, respectively of pull-up and pull-down, connected to form an output terminal for connection to the rows in a sector of the matrix.

2. Discussion of the Related Art

As is well known, read-only memories of the flash type have made substantial inroads as non-volatile memories because they can combine the advantages of high density that typify EPROMs with the capability of being programmed and erased electrically in the same way as EEPROMs.

Memories of this kind are constructed as matrices of cells, wherein each cell includes a floating gate transistor. Each transistor has a drain region and a source region which are formed on a semiconductor substrate and separated by a channel region.

A floating gate is formed over the substrate and isolated therefrom by a thin layer of gate oxide. A control gate is coupled capacitively to the floating gate by means of a dielectric layer. Metallic electrodes are arranged to contact the drain, source, and control gate such that predetermined voltage values can be applied to the memory cells.

The cell matrix is laid out into rows, or word lines, and columns, or bit lines. The cells of one word line share the electrical line that drives their respective control gates, while the cells of one bit line have their drain terminals in common.

By applying suitable voltage values to the cell terminals, the amount of the charge present in the floating gate can be varied, and since the floating gate has a high impedance toward any other terminals of the cell, the charge stored in it can be maintained indefinitely, even when the supply is cut off to the circuit in which it is included.

The operation whereby a charge is stored into the floating gate is called "programming" and consists of biasing the drain terminal and control gate at a predetermined higher value than the potential of the source terminal.

This programming of the individual cells is carried out by a hot electron injection process which allows electrons to become trapped inside the floating gate when the control gate is applied approximately 12 volts, with the source terminal being connected to ground and the drain terminal held at a drain voltage of about 5.5 volts.

In order to erase a flash memory cell, its source terminal is applied a voltage approximately equal to the supply voltage Vcc, the drain terminal is held floating, and the control gate is either led to ground or biased with a negative voltage.

In the field of application of the present invention, the negative voltage being applied to the decoding circuit during the steps of erasing the contents of the memory cells requires appropriate control.

A prior technical solution for properly controlling this negative voltage is described in U.S. Pat. No. 5,126,808, (hereinafter the "'800 Patent") which discloses a structure of a flash EEPROM matrix and respective erasing circuitry by the sector.

While being in many ways advantageous, this prior solution is not devoid of drawbacks, as detailed herein below.

The row decoding circuit structure described in the '808 Patent provides for a final stage which includes a pull-up transistor and a pull-down transistor placed on opposite sides of an output terminal being connected to the word lines of the memory matrix.

Connected between the output terminal and the pull-down transistor is a P-channel transistor whose control terminal is applied a negative voltage during the step of erasing the memory cells.

This negative voltage must be supplied from a dedicated negative charge pump to allow the word lines to be driven to ground during the erasing step.

The provision of such a charge pump unavoidably involves some consumption of circuit area as well as of current, since the pump must be kept under power even while in the standby state to ensure a fast time of access to the memory upon exiting the standby state.

In addition, the input stage of the decoding circuit described in the '808 Patent includes a NAND portion incorporating P-channel transistors, which burdens the circuit construction.

Finally, no provision is made in this prior solution for an accurate regulation of the row decoding supply voltages to make the unselected sectors of the matrix fully independent of the operations being performed on a given selected sector.

An object of the present invention is to provide a novel row decoding circuit and method which have such constructional and functional features as to overcome the aforementioned drawbacks of conventional solutions.

SUMMARY OF THE INVENTION

An embodiment of the invention is directed to a row decoding circuit for an electrically programmable and erasable semiconductor non-volatile storage device of a type having a matrix of memory cells laid out as rows and columns. The matrix is divided into sectors such that each sector has a corresponding plurality of rows. The row decoding circuit includes an input stage that receives input row decode signals and supply voltages, and an output stage that is driven by the input row decode signals and the supply voltages. The output stage has a complimentary pair of high-voltage moss transistors including a pull up transistor and a pull down transistor. The pull up and pull down transistors are connected to form an output terminal. The output terminal is connected to a plurality of rows corresponding to a sector of the matrix. The output stage further includes a moss transistors of the P channel depletion type with enhanced gate oxide. The moss transistor is disposed between the output terminal and the pull down transistors.

Another embodiment of the invention is directed to a row decoding method for an electrically programmable and erasable semiconductor non-volatile memory of a type which includes a matrix of memory cells laid out as cell rows and columns and is divided into sectors. The memory receives as inputs row decode signals and supply voltages in order to drive an output stage incorporating a complimentary pair of high voltage moss transistors of the pull up and pull down type, respectively, which are connected to form an output terminal connected to rows of one sector of the matrix. The method includes a step of operating a plurality of local supply switches. Each local supply switch is associated with a decoding circuit of a matrix sector.

The features and advantages of the circuit and the method of the present invention will be apparent from the following detailed description of embodiments thereof, given by way of non-limitative examples with reference to the accompanying drawings.

DETAILED DESCRIPTION

Figure 1:
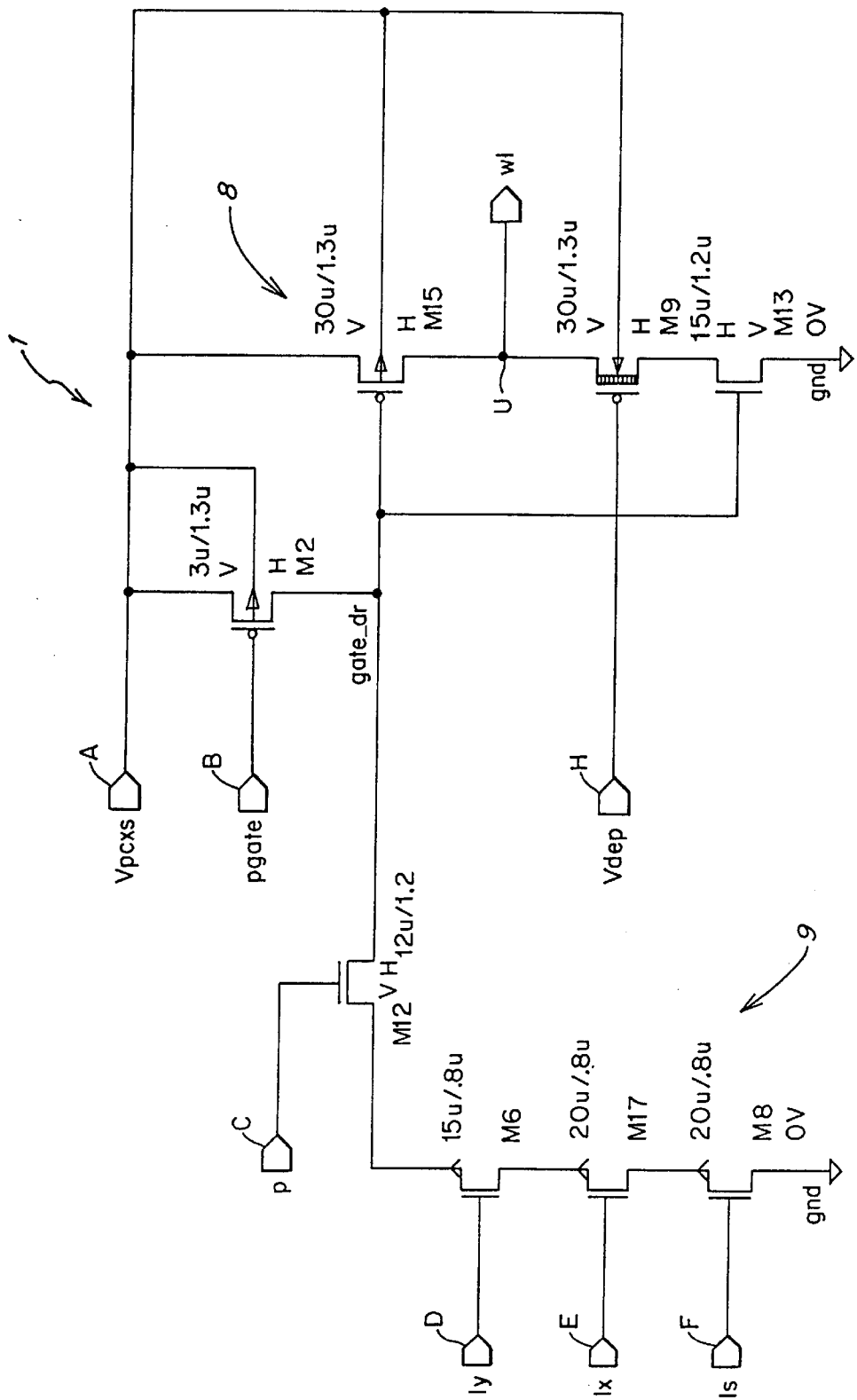
FIG. 1 is a diagrammatic representation of the circuit structure of a row decoding circuit according to the invention.

Referring in particular to the example of FIG. 1, generally and schematically shown at 1 is a row decoding circuit for electrically programmable/erasable non-volatile memory cells, such as cells of the flash EPROM type.

Each cell includes a MOS transistor having a floating gate G and a further control gate CG. The cells are laid out as a matrix 2 having rows WL, or word lines, and columns, or bit lines. All the cells of one word line WL share the electrical line which drives their respective control gates CG, while all the cells of one bit line have their drain terminals D in common.

The circuit 1 is particularly, but not solely, intended for a flash memory with a single power supply at a voltage Vcc of 5 volts. The invention has been applied to a memory made with double-well technology for erasing by a negative voltage to the cell gates.

Figure 2:
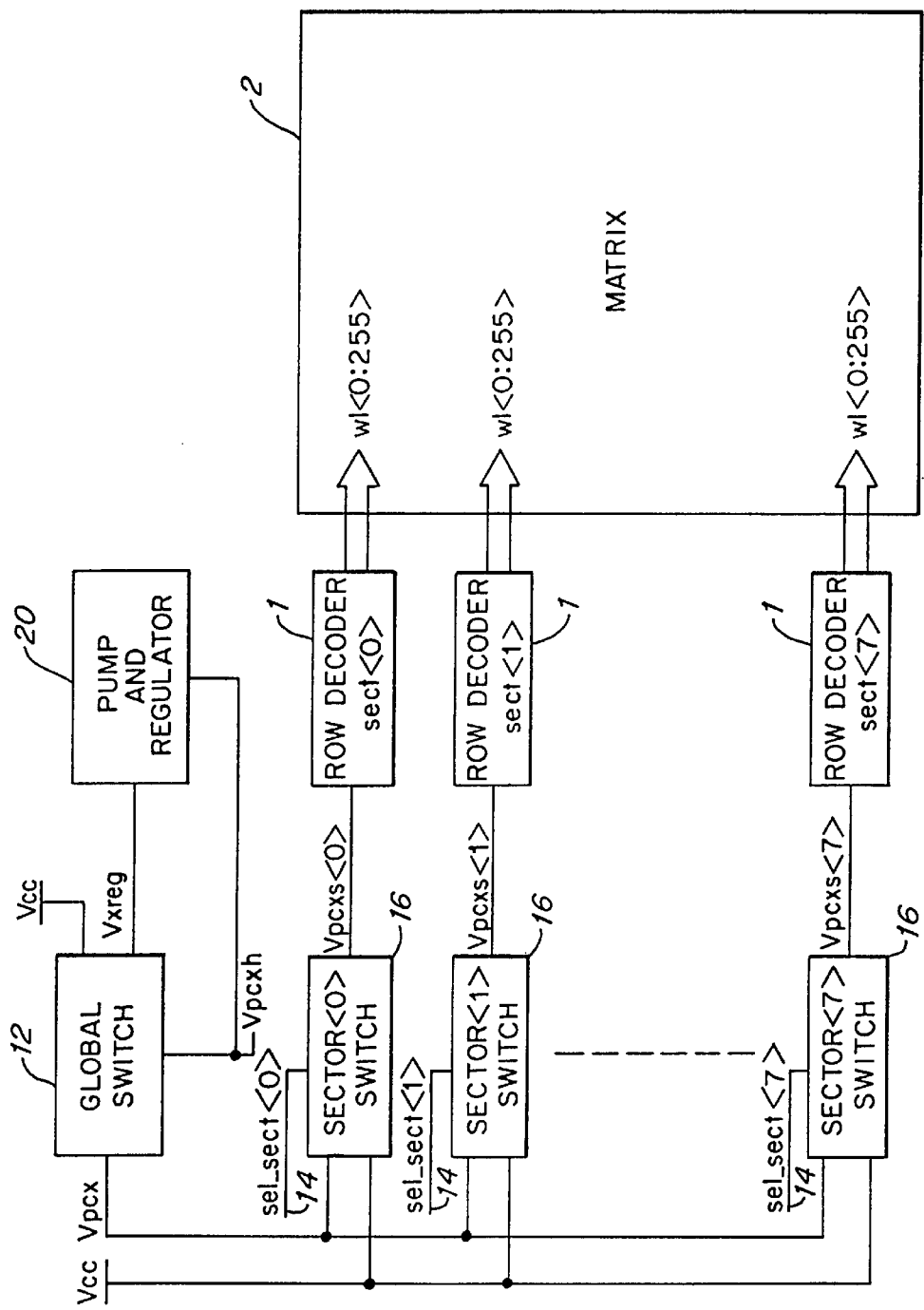
FIG. 2 is another diagrammatic representation of an integrated storage device incorporating row decoding circuits according to the invention.

In one embodiment, the cell matrix 2 has a capacity of four Megabytes, and is divided into eight sectors of 512 kilobytes, each with memory words of eight bits. Thus, the matrix 2 has eight decoding circuits according to the invention associated therewith, one per sector of the matrix as shown in FIG. 2.

The circuit 1 of the invention has a plurality of inputs and a control output U for the word lines of the matrix 2.

A first input A coincides with the drain terminal of a high-voltage pull-up transistor M2 of the P-channel MOS type. This transistor M2 has its source terminal connected to a circuit node gate_dr, its body terminal connected to the input A, and a control terminal B which coincides with a second input of the circuit 1.

Four N-channel MOS transistors are connected in series, between the circuit node gate_dr and a signal ground GND of the circuit 1, and indicated at M12, M6, M17 and M8, in this order. They form essentially a row decoding portion 9 of the NAND type. The first, M12, of these transistors is of the high-voltage type.

Each of the transistors has a control terminal of its own which is coincident with an input of the circuit 1. The respective inputs C, D, E and F of the circuit 1 are shown which receive row decode signals p, ly, lx and Is, respectively.

Connected between the circuit node gate_dr and the output U of the circuit is an output stage 8 which includes a high-voltage P-channel MOS transistor M15 having its control terminal connected to the node gate_dr, its drain and body terminals connected to the input A, and its source terminal connected to the output U. The transistor M15 acts essentially as a pull-up transistor between the input A and the output U. Advantageously, a pair of high-voltage transistors, as respectively indicated at M9 and M13, are placed between the output U and the ground GND. The transistor M13 acts as a pull-down transistor, and can be regarded as the complement of the transistor M15 in the output stage 8.

In essence, the transistor M9 is connected between the word line and the pull-down transistor of the decoding circuit. This transistor M9 is a P-channel depletion transistor having the gate oxide thickness increased to at least 330 Ångströms.

The control terminal of the transistor M9 forms an input H of the circuit 1. The body terminal of the transistor M9 is in common with the body terminal of the transistor M15.

The second transistor M13 in the complementary pair is an N-channel pull-down MOS, and has its control terminal connected to the node gate_dr, its source terminal to ground, and its drain terminal to the source terminal of the transistor M9.

Figure 6:
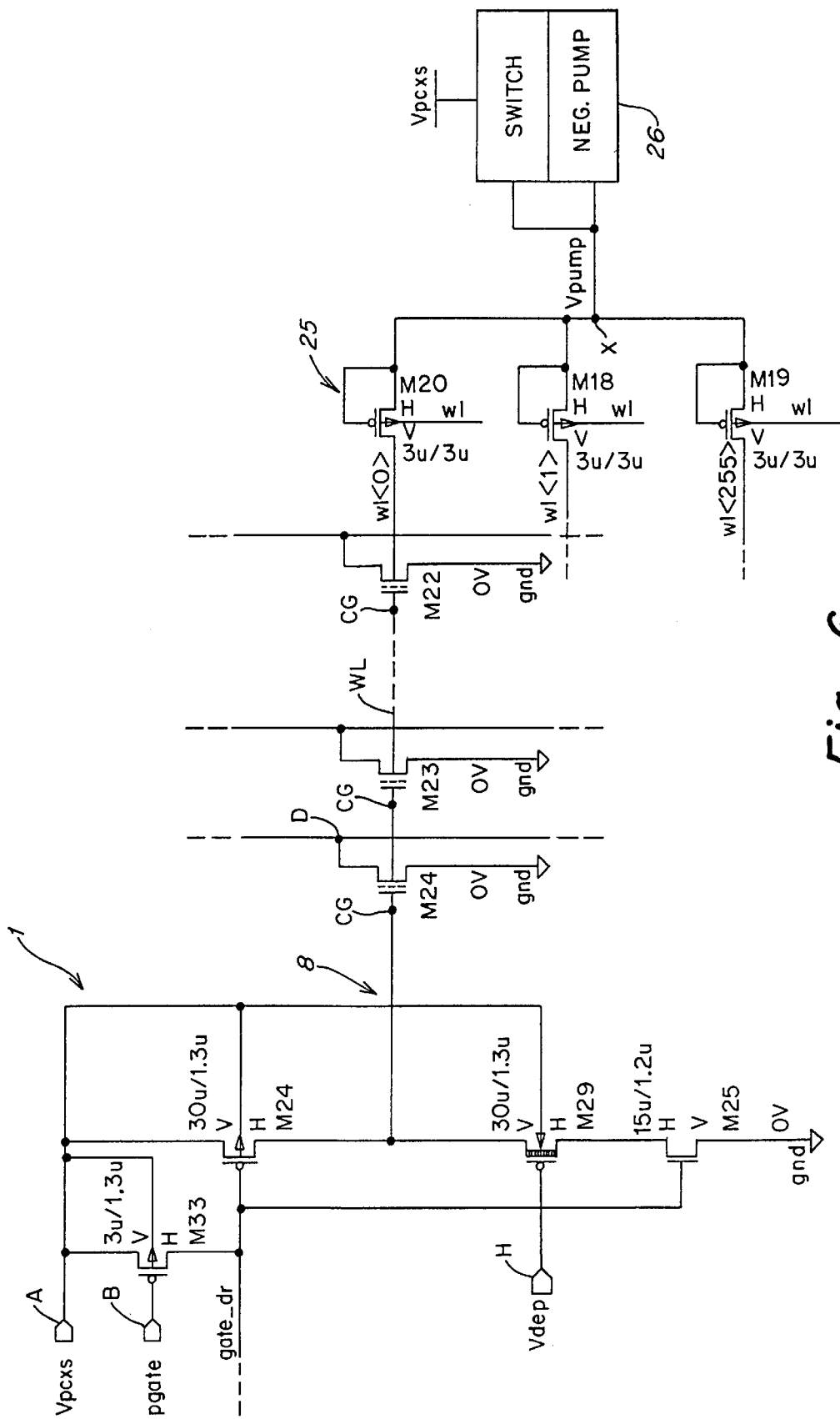
FIG. 6 illustrates diagrammatically the connection of a row decoding circuit according to the invention to a row of the storage device with which the circuit is associated.

Referring now to the example of FIG. 6, it can be seen that the output stage 8 of the circuit 1 is connected to the rows or word lines of one sector of the matrix 2 through the output U being connected directly to the control gate CG terminals of the cells.

Advantageously, a row diode 25 is placed at the end of each word line which is connected, on the one side, to the row itself, and on the other, to a node X adapted to receive a negative voltage Vpump from a negative charge pump 26.

According to an embodiment of the invention, the diode 25 includes of a high-voltage P-channel MOS transistor of the "nofield" type, in a diode configuration. This transistor has gate oxide of increased thickness compared to a standard transistor, and has a gate surrounding the active areas.

The diode 25 is located within a well which is biased by a signal W1, which is normally held at a signal Vpcxs and forced to ground at the matrix sectors being erased.

The use of a high-voltage diode 25 provides two advantages in that it has a higher breakdown voltage when reverse biased, and that is allows higher negative voltages to flow through the memory cell gates when operated at a low supply voltage Vcc.

The node X is driven at a negative voltage from the pump 26 during the erasing step only, and is otherwise held at the voltage Vpcxs by a local switch 16 to be described.

The operation of the circuit 1 according to the invention will now be described.

The decoding circuit 1 sends appropriate signals to the word lines of the matrix 2, according to row decode signals and other signals applied thereto.

The input A is applied a voltage signal Vpcxs, which is then transferred to the circuit node gate_dr through the pull-up transistor M2. This transistor M2 is to keep the unselected rows grounded, both during the reading step and the step of modifying or verifying the contents of the cell. Under these conditions, in fact, the voltage Vpcxs is higher than the supply voltage Vcc.

Figure 3:
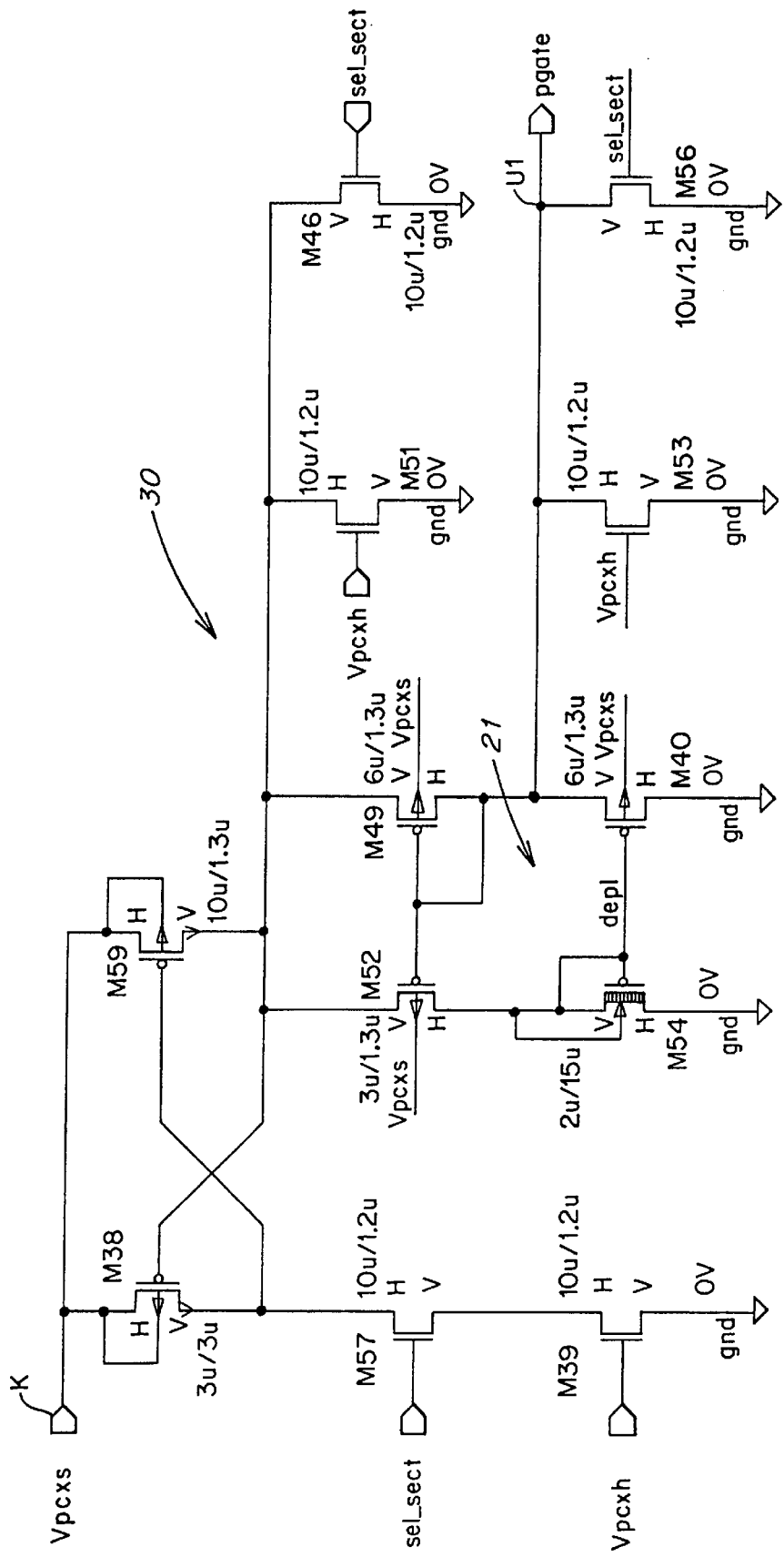
FIG. 3 is a diagram of a particular supply circuit according to the invention and intended for co-operation with the decoding circuit of FIG. 1.

The second input B receives a signal pgate from a regulator 30, to be described with reference to FIG. 3.

The technology currently in use to make integrated storage circuits requires that the aforementioned negative erase voltage be only applied to P-channel transistors formed in N wells biased at voltages equal to or higher than zero volts.

In fact, N-channel transistors are instead formed in P wells connected to ground, and would be forward biased if a negative voltage were applied to them.

By providing the P-channel transistor M9 of the depletion type, a voltage Vdep within the range of 0 volts to supply voltage Vcc can be applied to the input H.

Specifically, Vdep takes the value of Vcc during the erasing step, when a negative voltage must be applied to the gates of the memory cells.

Thus, the presence of the depletion P-channel transistor M9 has a major advantage in that it avoids the need for a negative charge pump which would take up circuit area and draw current even while the circuit is in the standby state.

Also, the wait time for bringing the input H to a negative voltage after a power-up is suppressed.

The supply voltage Vpcxs to the decoding circuit 1 advantageously assumes different values in the course of the steps for modifying or verifying the state of the memory cells. These values may be higher or lower than, or equal to, the supply voltage Vcc.

The different voltage values are generated by a voltage regulator having a charge pump associated therewith.

The regulator/charge pump assembly can be regarded as an ideal voltage generator having a series resistance of about 15 kiloohms.

It matters that the switching from one voltage value to another should take place within the shortest possible time, e.g. within microseconds.

For this purpose, a decoding circuit according to the invention has been associated with each of the eight sectors of the matrix 2, which circuit is independently supplied a locally switched voltage.

In accordance with the invention, an arrangement for switching the row decode supply is provided. This arrangement includes a main switch 12 (Global Switch) and a set of eight local switches 16 (Sector <i> Switch).

The main switch 12 is connected to the supply voltage reference Vcc and the voltage generator 20. The main switch 12 is supplied a voltage $Vx_{reg}$ and a voltage value $Vp_{cxh}$ from the generator 20. Advantageously, the input node of the generator 20 which receives the voltage value $Vx_{reg}$ only sees some of the parasitic capacitance of the decoding circuit 1.

The value $Vp_{cxh}$ is a logic signal for enabling the generator 20, and a select signal of the main switch 12. When the value $Vp_{cxh}$ equals Vcc, the charge pump and regulator are powered up to bring the output from the main switch 12 to a value $Vp_{cx}=Vx_{reg}$.

The individual local switches 16 are input both the supply voltage Vcc and the output voltage signal $Vp_{cx}$ from the main switch 12.

The following Tables show the voltages supplied to the local switches 16 according to the operations to be performed on the memory cells, namely: reading, writing or erasing.

TABLE 1

GLOBAL SWITCH

| operation | Vpcx |
|---|---|
| Read | Vcc |
| Erase | Vcc |
| modify/verify | Vxreg |

TABLE 2

SECTOR SWITCH

| | | Vpcxs | |
|---|---|---|---|
| operation | | selected sector | not selected sector |
| read | | Vpcx | Vcc |
| erase | | Vpcx | Vcc |
| mod/vfy | Vpcx > Vcc + Vt | Vpcx | Vcc |
| | Vpcx < Vcc + Vt | Vpcx | Vpcx-Vt |

In Table 2, the voltage Vt represents the threshold for an N-channel transistor.

The selection of each switch 16 is effected through an eight-wire bus 14, through which an enable signal SEL_SECT<0:7> is transmitted.

When the signal SEL_SECT<i> has the same value as Vcc, the i-th switch 16 is selected. Two different switches 16 cannot be actuated simultaneously. Basically, they can only be actuated in a mutually exclusive manner.

Each local switch 16 outputs a voltage signal Vpcxs<i>, which is input directly to the corresponding row decoding circuit 1. As previously explained, the circuit 1 receives the voltage signal Vpcxs from the corresponding switch on the drain terminal of the pull-up transistors M2 and M5.

The solution adopted here has a major advantage in that the unselected sectors are left off, and are unaffected by operations being carried out on the selected sector.

In addition, the charge pump incorporated to the regulator 20 can be made small, and yet ensure a switching time on the order of microseconds.

The construction of the voltage regulator 30 producing the value pgate will now be described in detail with particular reference to the example of FIG. 3.

The regulator 30 includes a current generator 21 which is independent of the voltage Vpcxs being supplied to the circuit 1.

The generator 21 includes a set of transistors M52, M49, M54 and M40. These transistors are all of the high-voltage P-channel MOS type. The transistor M54 is of the depletion type and has its source terminal forced to a voltage value of 0 volts.

The transistors M52 and M49 have their respective control terminals connected together into a first current mirror. A similar connection is provided between the transistors M54 and M40.

The remaining transistors in the regulator 30 are basically enable transistors which receive actuation signals on their control terminals.

More particularly, the regulator 30 has an input terminal K which is applied the voltage signal Vpcxs, and an output terminal U1 for generating the signal pgate. Also connected to this input K are the body terminals of the transistors M52, M49 and M40.

A pair of transistors M38 and M59 in a diode configuration are cross-connected between the input terminal K and the drain terminals of the transistors M52 and M49 of the generator 21.

A series of two N-channel transistors M57 and M39 are placed between these drain terminals and the ground GND.

The control terminals of the transistors M57 and M39 are applied respective control signals sel_sect and Vpcxh.

The control signals sel_sect and Vpcxh also are applied respectively to the respective control terminals of a pair of N-channel transistors M46 and M51 connected in parallel with each other between the drain terminals of transistors M52 and M49 and the ground GND.

Likewise, the control signals sel_sect and Vpcxh also are applied respectively to the respective control terminals of a pair of N-channel transistors M56 and M53 which are connected in parallel between the output terminal U1 of the regulator 30 and the ground GND.

With both control signals sel_sect and Vpcxh active, the output terminal U1 is driven by the regulator 30. In all of the other cases possible, the terminal U1 is held at ground value.

The depletion transistor M54 has a null voltage drop across its gate and source, and sets a constant current in the first leg of the generator 21. This current is mirrored and multiplied by two by the transistor M49 in the other leg of the generator 21.

The output pgate is picked up by the control terminal of the first current mirror M52, M49 of the generator 21. Consequently, the generator 21 will present a negative feedback that makes it little responsive to variations in the voltage Vpcxs.

In fact, when the voltage Vpcxs is increased, the voltage value at the control terminal of the transistor M52 must also increase because the current in that leg is impressed by the depletion transistor M54.

Also, should the voltage pgate go up, the gate-source voltage drop of the transistor M40 would tend to increase, but this is prevented by the current in that leg of the generator 21 being constant and set to be twice that in the other leg. Accordingly, the voltage at the control terminal of the transistor M40 is bound to go up.

A similar reasoning can be made in the event of the voltage Vpcxs being decreased.

Figure 4:
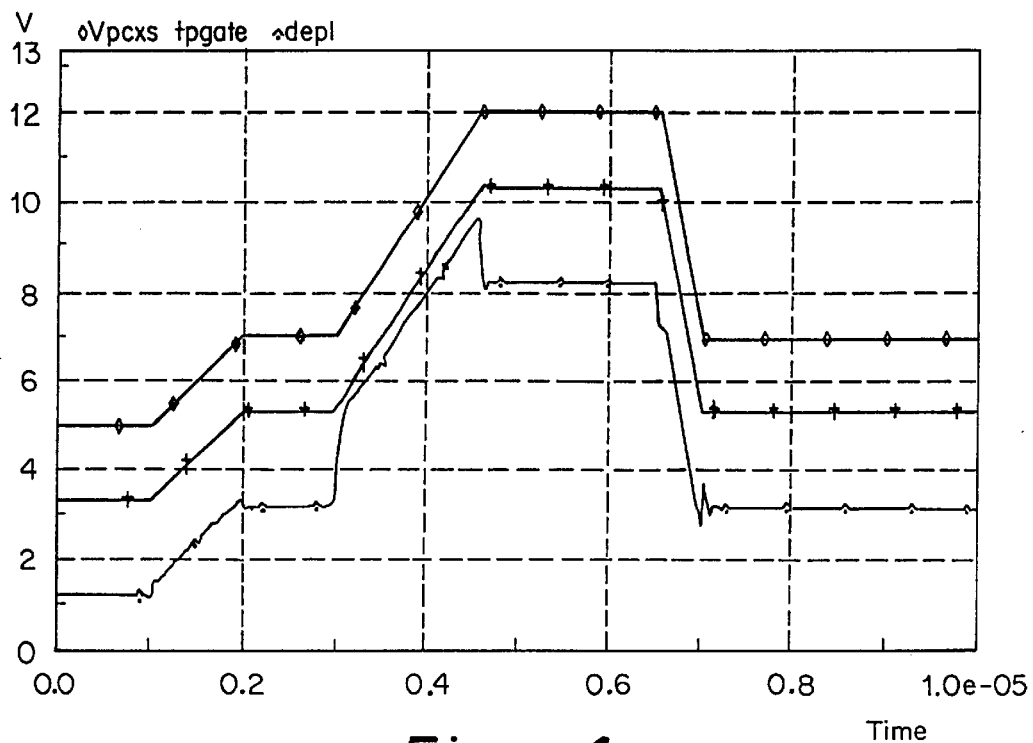
FIGS. 4 and 5 are respective plots vs. time of voltage and current signals appearing in the decoding circuit according to the invention.
Figure 5:
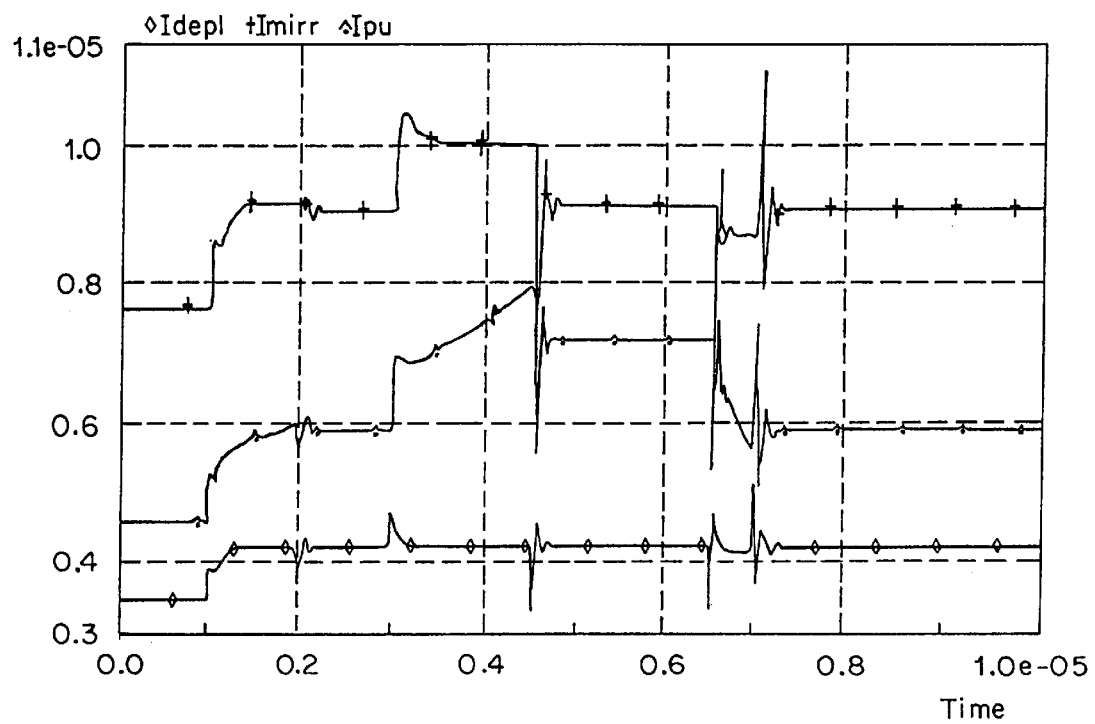

Shown in FIGS. 4 and 5 are the results of a simulation wherein the voltage Vpcxs undergoes changes which are typical of a step of modifying and/or verifying the contents of the memory cells.

The three currents plotted in FIG. 5 are, in this order:

Idepl—the current set by the depletion M54;

Imirr—the current of the first mirror M52, M49;

Ipu—the current of a decoding pull-up having the drain grounded and the source at Vpcxs.

The difference between the current Idepl and the current Ipu is only due to the difference between the voltage drop Vdg of the transistor M52 and the pull-up voltage.

This solution allows the P-channel portion of the selection NAND, as provided in conventional decoding circuits, to be omitted. In fact, only N-channel transistors M12, M6, M17 and M8 are present in the NAND portion 9 of the circuit 1.

When that portion 9 is made active by the concurrent appearance of the active signals p, ly, lx and ls, a current consumption toward ground occurs from the input A via the transistors M2, M12, M6, M17 and M8.

If the signal pgate were held at ground, this consumption would not be bearable in the presence of a voltage Vpcxs higher than the supply voltage Vcc.

Thus, by arranging a local regulator 30 to control the respective signal pgate of each sector, the consumption of the selected row can be limited without affecting the power-off speed of the unselected rows.

It can be stated that by using the signal pgate to control the decoding pull-up, the P-channel portion of the decoding NAND portion, which usually burdens conventional circuits, can be eliminated. Furthermore, the current draw from the pull-up can be kept under control.

Furthermore, it should be understood that the use of a high-voltage diode 25 at the row end enables the word line to withstand increased stresses during the erasing step, and hence to accept increased negative voltages.

Thus, the decoding circuit of the invention affords several advantages, and is an improvement on the prior art solutions that are still affected by problems of efficiency and reliability.

Modifications and changes may be made unto the circuit according to the invention within the scope of the following claims.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A row decoding method for an electrically programmable and erasable semiconductor non-volatile memory of a type which includes a matrix of memory cells laid out as cell rows and columns and divided into sectors, the memory receiving as inputs row decode signals and supply voltages to drive an output stage that includes an output terminal connected to rows of one sector of the matrix, the method comprising:

operating a plurality of local supply switches, each local supply switch connected to a respective decoding circuit of a matrix sector, wherein a first of the plurality of the local supply switches is connected to a first of the decoding circuits which includes the output stage; and actuating the first local supply switch such that an output signal is provided from the output terminal of the first decoding circuit to each of the cells of an entire row of the one sector.

2. The method of claim 1, wherein the step of operating includes a step of actuating two or more different local switches in a mutually exclusive manner.

3. A system for selectively performing operations on rows of an electrically programmable and erasable semiconductor non-volatile memory of a type which includes a matrix of memory cells arranged in rows and columns and divided into sectors, each sector including a plurality of the rows of the matrix, the system comprising:

a plurality of row decoders to select the sectors of the matrix, each row decoder for selecting a respective one of the sectors of the matrix, and each row decoder having a first input for receiving a voltage supply signal and an output to provide an output signal to each cell of an entire row of its respective sector; and a plurality of voltage switches, each voltage switch connected to a respective one of the row decoders of the matrix, and each voltage switch having an output to provide the voltage supply signal to the respective row decoder.

4. The system of claim 3, wherein, for each row, there is only one corresponding row decoder.

5. The system of claim 3, wherein each cell of the matrix has a control gate, and the output is connected to the control gate of each cell of the entire row.

6. The system of claim 3, each row decoder further having one or more second input signals to select the sector corresponding to the row decoder.

7. The system of claim 3, wherein each of the voltage supply switches is configured to be actuated mutually exclusively to the other voltage supply switches.

8. The system of claim 3, each voltage switch further having a first input to receive a first voltage signal, a second input to receive a second voltage signal and a third input to receive an enable signal to selectively enable the voltage switch.

9. The system of claim 8, wherein, for each switch, if the enable signal has a first value, the voltage supply signal has a value corresponding to the first voltage signal and if the enable signal has a second value, the voltage supply signal has a value corresponding to the second voltage signal.

10. A method of selectively performing operations on rows of an electrically programmable and erasable semiconductor non-volatile memory of a type which includes a matrix of memory cells arranged in rows and columns and divided into sectors, each sector including a plurality of the rows of the matrix, and the matrix connected to a plurality of row decoders to select the sectors of the matrix, each row decoder connected to a respective one of the sectors of the matrix, and each row decoder operative to provide an output signal to each of the plurality of rows of the respective sector, the method comprising:

selecting a first sector of the plurality of sectors of the matrix;

actuating a first row decoder of the plurality of row decoders, the first row decoder connected to the first sector, such that a first output signal of the first row decoder is provided to each cell of an entire row of the first sector; and concurrently to actuating the first row decoder, preventing actuation of the remaining row decoders.

11. The method of claim 10, wherein each cell of the matrix has a control gate, and the act of actuating comprises: providing the first output signal to the control gate of each cell of the entire row.

12. The method of claim 10, wherein the act of actuating further comprises providing a first supply voltage to the first row decoder, and wherein the act of preventing actuation comprises providing a second supply voltage different from the first supply voltage to each of the remaining row decoders.

13. The method of claim 10, wherein the act of actuating further comprises switching a supply voltage supplied to the first row decoder from a first voltage value to a second voltage value.

14. The method of claim 10, further comprising:

providing a plurality of voltage supply switches, each voltage supply switch connected to and controlling the voltage supplied to a respective one of the row decoders.

15. The method of claim 14, wherein each of the voltage supply switches is operative to be actuated mutually exclusively to the other voltage supply switches.

16. A system for selectively performing operations on rows of an electrically programmable and erasable semiconductor non-volatile memory of a type which includes a matrix of memory cells arranged in rows and columns and divided into sectors, each sector including a plurality of the rows of the matrix, the system comprising:

a plurality of row decoders to select the sectors of the matrix, each row decoder connected to a respective one of the sectors of the matrix, and each row decoder operative to provide an output signal to each of the plurality of rows of its respective sector; and means for actuating a first row decoder of the plurality of row decoders connected to a first sector of the matrix such that a first output signal of the first row decoder is provided to each cell of an entire row of the first sector and such that the other row decoders of the plurality of row decoders are not actuated.

17. The system of claim 16, wherein each cell of the matrix has a control gate, and the means for actuating comprises means for providing the first output signal to the control gate of each cell of the entire row.

18. The system of claim 16, wherein the means for actuating further comprises means for providing a first supply voltage to the first row decoder and means for providing a second supply voltage different from the first voltage to each of the remaining row decoders.

19. The system of claim 16, wherein the means for actuating further comprises means for switching a supply voltage supplied to the first row decoder from a first voltage value to a second voltage value.

20. The system of claim 16, further comprising:

a plurality of voltage supply switches, each voltage supply switch controlling the voltage supplied to a respective one of the row decoders.

21. The system of claim 20, wherein each of the voltage supply switches is operative to be actuated mutually exclusively to the other voltage supply switches.

* * * * *

UNITED STATES PATENT AND TRADEMARK OFFICE
CERTIFICATE OF CORRECTION

PATENT NO. : 6,320,792 B1
DATED : November 20, 2001
INVENTOR(S) : Fabio Tassan Caser, Mauro Sali and Marcello Cane It is certified that error appears in the above-identified patent and that said Letters Patent is hereby corrected as shown below:

<u>Title page,</u>
Item [12], should read -- Tassan Caser et al. --

Signed and Sealed this

Sixteenth Day of April, 2002

*Attest:*

JAMES E. ROGAN
*Attesting Officer*  *Director of the United States Patent and Trademark Office*